United States Patent [19]

Maier et al.

[11] Patent Number: 5,270,579
[45] Date of Patent: Dec. 14, 1993

[54] CIRCUIT ARRANGEMENT FOR GENERATING AN INVERSE VOLTAGE FOR SWITCHING DIODES

[75] Inventors: Gerhard Maier, Dauchingen; Bertram Fischer, Deisslingen, both of Fed. Rep. of Germany

[73] Assignee: Deutsche Thomson-Brandt GmbH, Villingen-Schwenningen, Fed. Rep. of Germany

[21] Appl. No.: 988,604

[22] Filed: Sep. 14, 1992

Related U.S. Application Data

[63] Continuation of PCT/EP91/00297, Feb. 15, 1991.

[30] Foreign Application Priority Data

Feb. 26, 1990 [DE] Fed. Rep. of Germany ....... 4006018

[51] Int. Cl.$^5$ .............. H03K 17/74; H04B 1/18
[52] U.S. Cl. ...................... 307/259; 307/256; 455/190.1
[58] Field of Search .............. 307/259, 256; 333/174; 455/190.1, 191.2, 180.4, 340

[56] References Cited

U.S. PATENT DOCUMENTS

| | | | |
|---|---|---|---|
| 3,980,957 | 9/1976 | Pützer | 455/180.4 |
| 4,555,808 | 11/1985 | Fujimoto | 455/191.2 |
| 4,598,423 | 7/1986 | Hettiger | 455/191 |
| 4,710,974 | 12/1987 | Kupfer | 455/190.1 |
| 4,736,457 | 4/1988 | Kupfer | 455/190.1 |
| 4,758,736 | 7/1988 | Agoston et al. | 307/259 |

FOREIGN PATENT DOCUMENTS 3240491 12/1981 Fed. Rep. of Germany.

Primary Examiner—William L. Sikes
Assistant Examiner—Toan Tran
Attorney, Agent, or Firm—J. S. Tripoli; E. P. Herrmann; L. L. Hallacher

[57] ABSTRACT

A circuit for generating a cut-off voltage for the switching diodes in a high frequency filter by rectifying the output signal of an oscillator includes a first diode which has a low threshold voltage and which rectifies the output signal to apply the cut-off voltage to the switching diodes in a first mode of operation. A second diode, having a low resistance, is parallel to the first diode and by-passes the first diode in a second mode of operation.

6 Claims, 1 Drawing Sheet

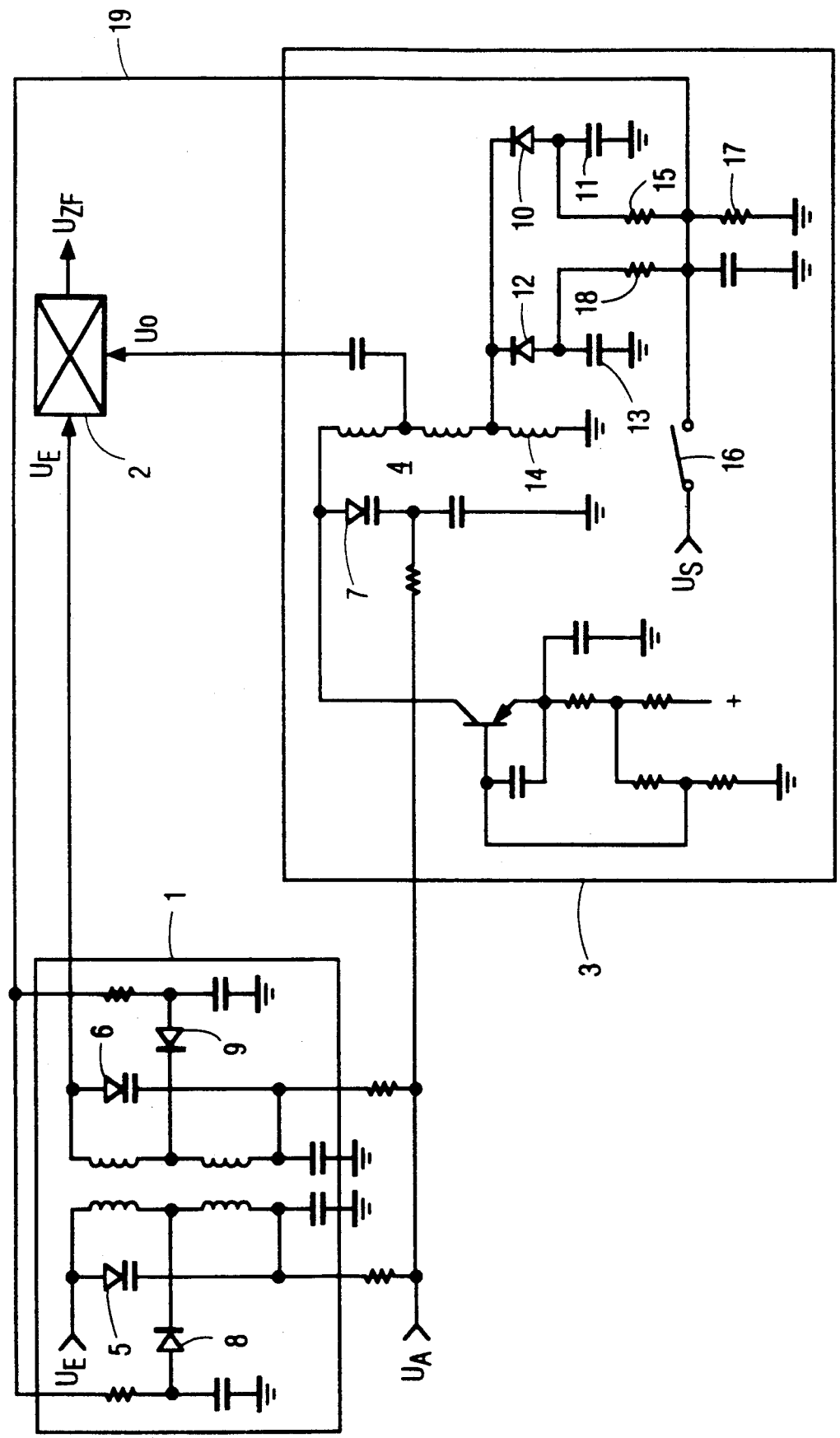

CIRCUIT ARRANGEMENT FOR GENERATING AN INVERSE VOLTAGE FOR SWITCHING DIODES

This is a continuation of PCT Application PCT/EP 91/00297 filed Feb. 15, 1991 by Gerhard Maier and Bertram Fischer and titled "CIRCUIT ARRANGEMENT FOR GENERATING AN INVERSE VOLTAGE FOR SWITCHING DIODES".

This invention is directed to a circuit for generating the cut-off voltage for the switching diodes which change the resonance frequency of a high frequency (HF) filter circuit by rectifying the oscillator voltage of an oscillator.

Telecommunications regulations require a very small perturbing radiation at the antenna input socket of a television receiving device. In particular, TV receivers which reproduce several pictures on the display screen using a supplementary reception tuner cannot have interference with other reception channels. For example, the requirement to be fulfilled is that the interference voltage at the antenna socket must be less than 30 db, this means that the voltage may have a maximum value of 30 db above zero microvolts (approx. 32 microvolts). With such 'picture-in-picture' devices, two tuners are supplied from the same antenna and a power splitter, in cooperation with a directional coupler, provides signals to the two tuners, thus maximum decoupling is required and must be wide band at 30 db. However, this means that the amplitude of the oscillator signal in the television receiver must be effectively limited to values of approximately 0.8 to 1.0 V.

It is conventional to change-over the filter circuits located in a receiver to the different bands by means of switching diodes. In doing so, a negative voltage is applied to the anode of the switching diodes so that diodes are blocked to switch on additional inductances. The negative voltage is generated by rectifying the oscillator signal using a rectifier diode arranged within the oscillator circuit. This rectifier diode is active in band 1 operation; in band 2 operation the diode is biased by a positive direct voltage which is externally applied in the conducting direction. Because, as required, the oscillator voltage is kept very low, the generation of a negative voltage of appreciable value is difficult. At most, the rectifier diode yields a negative direct voltage in the order of 0.1 to 0.3 V, this voltage is not sufficient to definitely block the switching didoes. Accordingly, the cut-off of the diode is insufficient in band 1. Also, range suppression cannot be avoided because the blocking capacities of the switching diodes become large. This disadvantage can be circumvented by blocking the switching didoes using a negative direct voltage which is generated by additional circuitry in the television receiver. However, an additional negative voltage is then required in addition to the positive change-over voltage for band 1 and band 2. However, this measure is expensive because it necessitates a supplementary winding on the main transformer and additional rectification.

It is an object of the invention to make possible generation of a negative direct voltage from the oscillator signal in band 1 despite the low circuit voltage.

A preferred embodiment is shown in the FIGURE.

In the FIGURE, an input signal $U_E$ is applied to a frequency conversion stage 2, by a band-pass filter 1, the other input terminal of conversion stage 2 receives the oscillator signal $U_o$ from an oscillator 3. An intermediate frequency signal $U_{ZF}$ is available at the output terminal of the frequency conversion stage 2. The filter circuits of the filter 1, as well as the oscillation circuit 4 of the oscillator 3, can be tuned-in by a tuning voltage by means of variable capacitance diodes 5, 6 and 7. Switching diodes 8 and 9, which are biased by either a switching voltage $U_S$ or blocked by a blocking voltage, serve to change over the band of the filter circuits when a negative cut-off voltage is applied to the anodes of diodes 8 and 9.

Since the oscillator signal has a very small amplitude, a rectifier diode 10, having a very low threshold voltage, in the order of 0.15 to 0.25 V in this example, is used to generate the negative cut-off voltage. The use of the diode 10, which preferably is a Schottky diode, allows a negative direct voltage in the order of 0.8 V to be obtained. The cathode of the Schottky diode 10 is connected to the oscillator coil 14. The anode of diode 10 is connected to reference potential, ground in this example, by a capacitor 11. A switching voltage $U_S$ is applied to the diode 10 by a resistor 15 and a switch 16. Also, the resistor 15 is connected, by an RC module 17, to the reference potential at which the cut-off voltage can be picked up and applied by the line 19 to the switching diodes 8 and 9 in the HF filter circuit. However, the diode 10 has the disadvantage of a relatively high internal resistance, which can be in the order of 10 ohms. This high resistance hinders the operation of the oscillator in the band 2 mode, i.e. when the Schottky diode is switched by a positive switching voltage $U_S$ and by-passes the coil 24 of the oscillator circuit 4. Therefore, a further measure of the invention is the incorporation of a switching diode 12 in parallel with the Schottky diode 10. The anode of the diode 12 is connected to the reference potential by capacitor 13. The switching voltage $U_S$ is applied to the diode 12 via a resistor 18. The diode 12 by-passes the diode 10 with low resistance in the band 2 mode upon application of the switching voltage US. This parallel-switched diode 12 consists of, for example, a silicon diode having very low resistance, in the order of 0.8 ohm and a relatively high forward voltage. Accordingly, the generation of both the negative direct voltage by means of Schottky diode 10 for the band 1 mode, and a low resistance change-over of the oscillator coil through the silicon diode 12 for the band 2 mode is guaranteed.

We claim:

1. A circuit for generating a cut-off voltage for the switching diodes in a high frequency filter by rectifying the output signal of an oscillator comprising:
   a first diode having a low threshold voltage for rectifying said output signal and applying said cut-off voltage to said switching diodes in a first mode of operation; and
   a second diode having a low resistance parallel to said first diode for by-passing said first diode in a second mode of operation.

2. The circuit of claim 1 further including a first capacitor for connecting said first diode to a reference voltage and a second capacitor for connecting said second diode to said reference voltage.

3. The circuit of claim 2 wherein said first diode is a Schottly diode.

4. The circuit of claim 3 wherein said second diode is silicon diode.

5. The circuit of claim 1 wherein said first diode is a Schottly diode.

6. The circuit of claim 5 wherein said second diode is silicon diode.

* * * * *